United States Patent
Shim

(10) Patent No.: US 10,983,884 B2
(45) Date of Patent: Apr. 20, 2021

(54) METHOD AND NON-VOLATILE MEMORY DEVICE FOR REPAIRING DEFECTIVE STRINGS IN UNITS OF STRING SELECTION LINES

(71) Applicant: Samsung Electronics Co., Ltd., Suwon-si (KR)

(72) Inventor: Sun Il Shim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 223 days.

(21) Appl. No.: 16/110,058

(22) Filed: Aug. 23, 2018

(65) Prior Publication Data
US 2019/0138414 A1 May 9, 2019

(30) Foreign Application Priority Data
Nov. 3, 2017 (KR) .................. 10-2017-0146180

(51) Int. Cl.
| | | |
|---|---|---|
| G06F 11/20 | (2006.01) | |
| G11C 16/04 | (2006.01) | |
| G11C 29/00 | (2006.01) | |
| G11C 16/10 | (2006.01) | |
| G11C 16/14 | (2006.01) | |
| H01L 27/11582 | (2017.01) | |
| G11C 16/26 | (2006.01) | |
| G11C 29/04 | (2006.01) | |

(52) U.S. Cl.
CPC ...... *G06F 11/2094* (2013.01); *G11C 16/0483* (2013.01); *G11C 29/76* (2013.01); *G06F 2201/82* (2013.01); *G11C 16/10* (2013.01); *G11C 16/14* (2013.01); *G11C 16/26* (2013.01); *G11C 29/04* (2013.01); *H01L 27/11582* (2013.01)

(58) Field of Classification Search
CPC .... G06F 3/0659; G06F 3/0679; G06F 3/0619; G06F 3/0614; H01L 27/11551; H01L 27/11578; H01L 27/11582; G11C 7/18; G11C 16/14; G11C 16/26; G11C 29/04
See application file for complete search history.

(56) References Cited

U.S. PATENT DOCUMENTS

| | | | |
|---|---|---|---|
| 5,349,558 A | | 9/1994 | Cleveland et al. |
| 5,696,929 A | * | 12/1997 | Hasbun ............... G06F 12/0246 711/103 |
| 6,388,925 B1 | | 5/2002 | Kim |

(Continued)

FOREIGN PATENT DOCUMENTS

| | | |
|---|---|---|
| KR | 19970003235 | 1/1997 |
| KR | 19990012752 | 2/1999 |

(Continued)

*Primary Examiner* — Joseph O Schell
(74) *Attorney, Agent, or Firm* — Harness, Dickey and Pierce, P.L.C.

(57) ABSTRACT

A non-volatile memory device may replace a defective string selection line connected to a defective string of a defective memory block among a plurality of memory blocks with a replacement string selection line of a repair memory block; and access the replacement string selection line of the repair memory block instead of the defective string selection line of the defective memory block. The non-volatile memory device performs a repair operation in units of string selection lines and may efficiently use repair resources.

17 Claims, 12 Drawing Sheets

(56) References Cited

U.S. PATENT DOCUMENTS

| | | |
|---|---|---|
| 6,426,902 B1 | 7/2002 | Lee et al. |
| 6,687,171 B2 | 2/2004 | Rehm et al. |
| 7,177,209 B2 | 2/2007 | Choi |
| 7,679,133 B2 | 3/2010 | Son et al. |
| 8,553,466 B2 | 10/2013 | Han et al. |
| 8,559,235 B2 | 10/2013 | Yoon et al. |
| 8,654,587 B2 | 2/2014 | Yoon et al. |
| 9,001,601 B2 | 4/2015 | Son et al. |
| 9,627,094 B2 | 4/2017 | Yano |
| 2008/0082736 A1* | 4/2008 | Chow ................. G06F 12/0246 711/103 |
| 2010/0306456 A1* | 12/2010 | Schmidberger ...... G11C 16/349 711/103 |
| 2011/0233648 A1 | 9/2011 | Seol et al. |
| 2013/0326312 A1* | 12/2013 | Lee ..................... G06F 12/0246 714/773 |
| 2014/0092685 A1* | 4/2014 | Yoon ................. G11C 16/3445 365/185.17 |
| 2014/0160847 A1* | 6/2014 | Kwak ..................... G11C 16/08 365/185.11 |
| 2015/0170749 A1* | 6/2015 | Park ....................... G11C 16/14 365/185.05 |

FOREIGN PATENT DOCUMENTS

| | | |
|---|---|---|
| KR | 100172349 | 3/1999 |
| KR | 10-0205545 B1 | 7/1999 |
| KR | 10-0443507 B1 | 8/2004 |
| KR | 10-0546140 B1 | 1/2006 |

\* cited by examiner

METHOD AND NON-VOLATILE MEMORY DEVICE FOR REPAIRING DEFECTIVE STRINGS IN UNITS OF STRING SELECTION LINES

CROSS-REFERENCE TO RELATED APPLICATION

This application claims the benefit of Korean Patent Application No. 10-2017-0146180, filed on Nov. 3, 2017, in the Korean Intellectual Property Office, the disclosure of which is incorporated herein in its entirety by reference.

BACKGROUND

Example embodiments of the inventive concepts relate to a semiconductor memory device. For example, at least some example embodiments relate to a method of repairing defective strings and/or a non-volatile memory device for repairing defective strings.

In order to increase a degree of integration of a semiconductor memory device, research into a memory device having a three-dimensional structure is being conducted. The three-dimensional semiconductor memory device has a structural characteristic different from a structural characteristic of a conventional two-dimensional semiconductor memory device. Due to a structural difference between the three-dimensional semiconductor memory device and the two-dimensional semiconductor memory device, research into various methods of driving the three-dimensional semiconductor memory device is being conducted.

For efficient management or operation of the three-dimensional non-volatile memory device, a repairing method capable of supporting operation of repairing a defective memory cell is being required.

SUMMARY

Example embodiments of the inventive concepts provide a method of repairing defective strings in units of string selection lines, a non-volatile memory device and/or a memory system for repairing defective strings in units of string selection lines.

According to an example embodiment of the inventive concepts, there is provided a method of repairing a defective string of a non-volatile memory device including a plurality of memory blocks, the method may include replacing a defective string selection line connected to a defective string of a defective memory block among the plurality of memory blocks with a replacement string selection line of a repair memory block; and accessing the replacement string selection line of the repair memory block instead of the defective string selection line of the defective memory block.

According to another example embodiment of the inventive concepts, there is provided a non-volatile memory device including a memory cell array including a plurality of memory blocks, the plurality of memory blocks including a plurality of strings, the plurality of strings each including a plurality of memory cells connected to a same one of a plurality of string selection lines; and a controller configured to replace a defective string selection line connected to a defective string of a defective memory block among the plurality of memory blocks with a replacement string selection line of a repair memory block, the defective string selection line being one of the plurality string selection lines, and the defective memory block and the repair memory block being ones of the plurality of memory blocks.

According to another example embodiment of the inventive concepts, there is provided a memory system including a memory controller; and a non-volatile memory device including, a memory cell array including a plurality of memory blocks, the plurality of memory blocks including a plurality of strings, the plurality of strings each including a plurality of memory cells connected to a same one of a plurality of string selection lines; and a controller configured to replace a defective string selection line connected to a defective string of a defective memory block among the plurality of memory blocks with a replacement string selection line of a repair memory block, the defective string selection line being one of the plurality string selection lines, and the defective memory block and the repair memory block being ones of the plurality of memory blocks.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Figure 1:
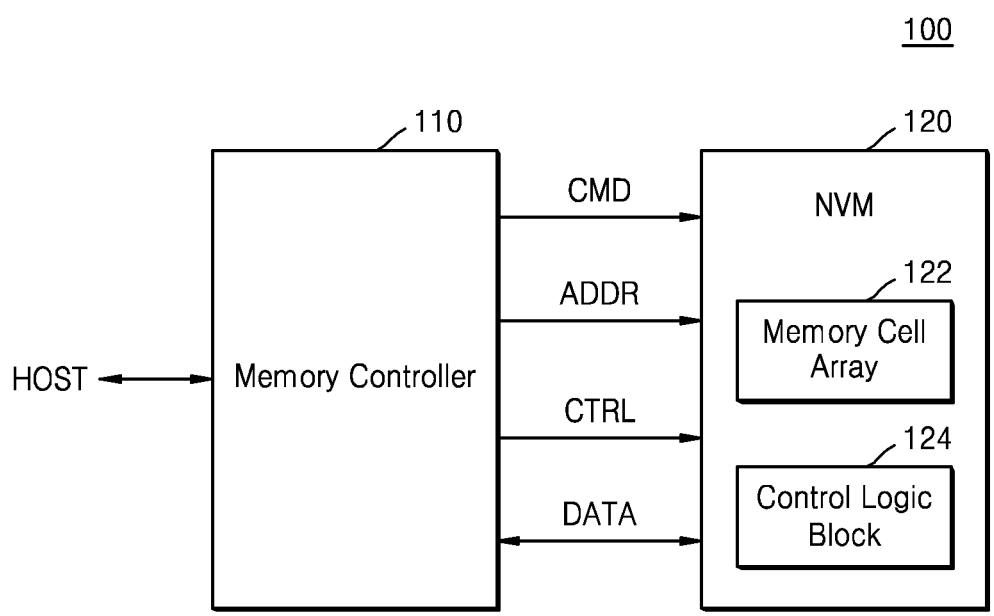
FIG. 1 is a block diagram illustrating a memory system according to an example embodiment of the inventive concepts.

FIG. 1 is a block diagram illustrating a memory system according to an example embodiment of the inventive concepts.

Referring to FIG. 1, a memory system 100 includes a memory controller 110 and a non-volatile memory device 120.

The non-volatile memory device 120 may be implemented by a memory chip. The non-volatile memory device 120 may include a memory cell array 122 and a control logic block 124. In some example embodiments, the memory system 100 may be implemented by an internal memory embedded in an electronic device and may be, for example, an embedded universal flash storage (UFS) memory device, an embedded multi-media card (eMMC), or an SSD. In some example embodiments, the memory system 100 may be implemented by an external memory releasable from an electronic device and may be, for example, a UFS memory card, a compact flash (CF) card, a secure digital (SD) card, a micro secure digital (micro-SD) card, a mini secure digital (mini-SD) card, an extreme digital (xD) card, or a memory stick.

The memory controller 110 may control the non-volatile memory device 120 to read data stored in the non-volatile memory device 120 in response to read/write request from a host HOST and/or to program data into the non-volatile memory device 120. In detail, the memory controller 110 may provide one or more commands, such as, a command CMD, an address ADDR, and a control signal CTRL, to the non-volatile memory device 120 and may control a program operation, a read operation, and/or an erase operation of the non-volatile memory device 120. In addition, data (DATA) for performing programming and read data DATA may be exchanged between the memory controller 110 and the non-volatile memory device 120.

The memory cell array 122 may include a plurality of memory cells, for example, flash memory cells. Hereinafter, example embodiments will be described in detail by taking a case in which the plurality of memory cells are NAND flash memory cells as an example. The memory cell array 122 may include a three-dimensional memory cell array including a plurality of NAND strings, as described in detail below with reference to FIGS. 3 and 4. However, example embodiments are not limited thereto.

The three-dimensional memory cell array is formed to be "monolithic" at at least one physical level of memory cell arrays having an active area arranged on a silicon substrate and a circuit formed on or in the substrate as a circuit related to operation of memory cells. The term "monolithic" means that layers of the respective levels that form the array are laminated immediately on layers of the respective lower levels in the array. According to an example embodiment of the inventive concepts, the three-dimensional memory cell array includes NAND strings arranged in a vertical direction so that at least one memory cell is positioned on another memory cell. The at least one memory cell includes a charge trap layer. Configurations of a three-dimensional memory array that is formed of a plurality of levels and in which word lines and/or bit lines are shared between levels are described in detail in U.S. Pat. Nos. 7,679,133, 8,553,466, 8,654,587, 8,559,235, and U.S. Patent Publication No. 2011/0233648, the entire contents of each of which are herein incorporated by reference in their entirety.

The control logic block 124 may include a controller having processing circuitry. The processing circuitry may be, but not limited to, a processor, Central Processing Unit (CPU), a controller, an arithmetic logic unit (ALU), a digital signal processor, a microcomputer, a field programmable gate array (FPGA), an Application Specific Integrated Circuit (ASIC), a System-on-Chip (SoC), a programmable logic unit, a microprocessor, or any other device capable of performing operations in a defined manner.

The controller of the control logic block 124 may be configured, through a layout design or execution of computer readable instructions stored in a memory, for example, the memory cell array 122, as a special purpose computer to control the non-volatile memory 120.

For example, the controller of the control logic block 124 may be configured as a special purpose computer to replace a defective string selection line connected to a defective string of a defective memory block among the memory blocks with a replacement string selection line of a repair memory block; and access the replacement string selection line of the repair memory block instead of the defective string selection line of the defective memory block.

Therefore, the control logic block 124 may improve the functioning of the non-volatile memory 120 and/or memory system 100 itself by more effectively using the limited number of repair memory blocks in a string based repairing method as compared to a block based repairing method.

The control logic block 124 may repair defective memory cells that form in the memory cell array 122. The control logic block 124 may replace a defective string selection line connected to a defective string of a memory block that includes a defective memory cell with a replacement string selection line of a repair memory block. The control logic block 124 may access the replacement string selection line of the repair memory block instead of the defective string selection line of the defective memory block.

Figure 2:
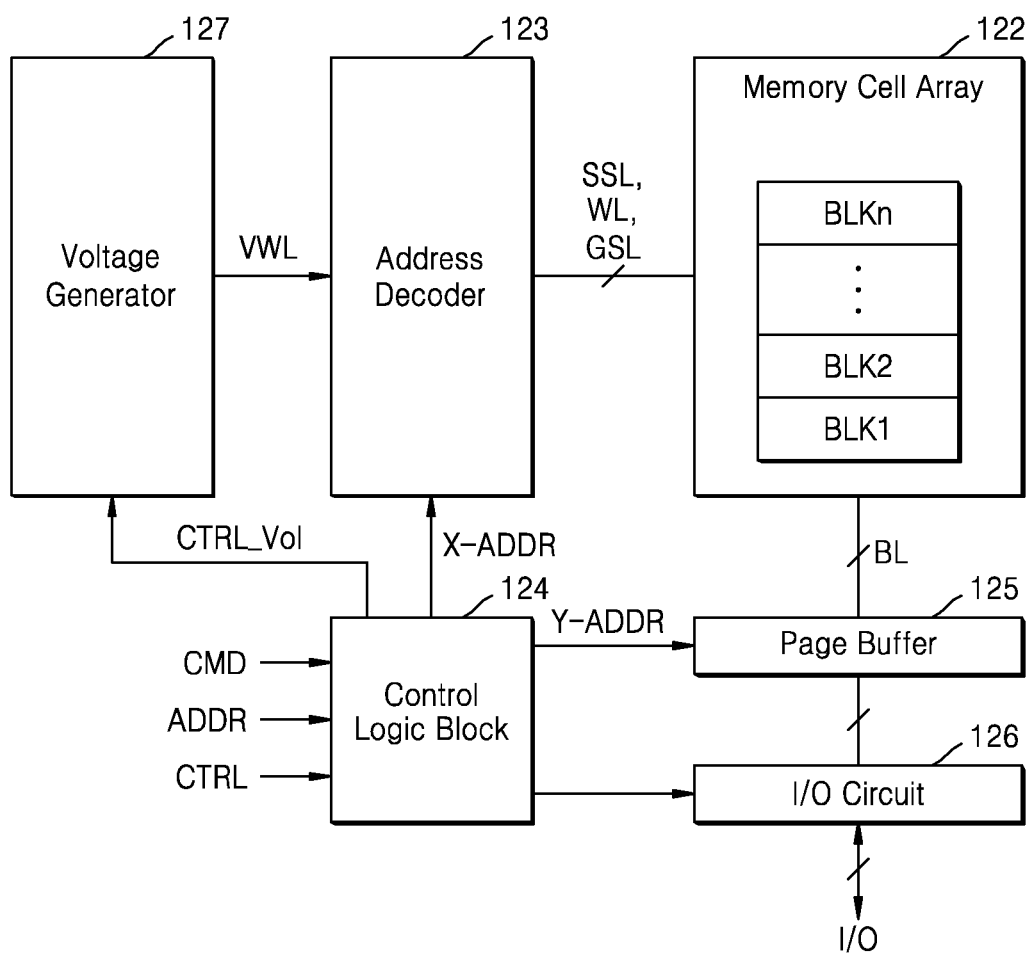
FIG. 2 is a block diagram illustrating a non-volatile memory device of FIG. 1.

FIG. 2 is a block diagram illustrating the non-volatile memory device 120 of FIG. 1.

Referring to FIG. 2, the non-volatile memory device 120 may include a memory cell array 122, an address decoder 123, a control logic block 124, a page buffer 125, an input and output circuit unit 126, and a voltage generator 127. Although not shown, the non-volatile memory device 120 may further include an input and output (I/O) interface.

The memory cell array 122 may be connected to word lines WL, string selection lines SSL, ground selection lines GSL, and bit lines BL. The memory cell array 122 is connected to the address decoder 123 through the word lines WL, the string selection lines SSL, and the ground selection lines GSL and may be connected to the page buffer 125 through the bit lines BL. The memory cell array 122 may include a plurality of memory blocks BLK1 to BLKn.

Each of the memory blocks BLK1 to BLKn may include a plurality of memory cells and a plurality of selection transistors. The memory cells are connected to the word lines WL, and the selection transistors may be connected to the string selection lines SSL or the ground selection lines GSL. The memory cells of each of the memory blocks BLK1 to BLKn may be formed of single level cells for storing 1-bit data or multilevel cells for storing M-bit data (M being greater than or equal to 2).

The address decoder 123 may select one of the plurality of memory blocks BLK1 to BLKn of the memory cell array 122, may select one of the word lines WL of the selected memory block, and may select one of the plurality of string selection lines SSL.

The control logic block 124 may output various control signals for performing a program operation, a read operation, and an erase operation on the memory cell array 122 based on the command CMD, the address ADDR, and the control signal CTRL. The control logic block 124 may provide a row address (X-ADDR) to the address decoder 123, may provide a column address (Y-ADDR) to the page buffer 125, and may provide a voltage control signal CTRL_Vol to the voltage generator 127.

The control logic block 124 may repair defective cells of the memory cell array 122 in units of string selection lines. The control logic block 124 may replace a defective string selection line connected to a defective memory cell within a string in a defective memory block among the memory blocks BLK1 to BLKn with a replacement string selection line of a repair memory block. The control logic block 124 may access the replacement string selection line of the repair memory block instead of the defective string selection line of the defective memory block.

The control logic block 124 may perform a program operation or a read operation on memory cells connected to the replaced string selection line of the repair memory block in response to the command CMD that commands a program operation or a read operation to be performed on the memory cells connected to the defective string selection line of the defective memory block.

The control logic block 124 may perform an erase operation on the memory cells of the defective memory block in response to the command CMD that commands an erase operation to be performed on the memory cells connected to the defective string selection line of the defective memory block. The control logic block 124 may also perform an erase operation on the memory cells of the repair memory block. The erase operation of the repair memory block may include an operation of moving data of memory cells except for the memory cells connected to the replaced string selection line to a temporarily set memory block, an operation of erasing data of the memory cells of the repair memory block, and moving data of memory cells of a temporarily set memory block to the repair memory block.

The page buffer 125 may operate as a write driver or a sense amplifier in accordance with an operation mode. In a read operation, the page buffer 125 may sense a bit line BL of a selected memory cell in accordance with control of the control logic block 124. Sensed data may be stored in latches provided in the page buffer 125. The page buffer 125 may dump the data stored in the latches to an input and output circuit unit 126 in accordance with control of the control logic block 124.

The input and output (I/O) circuit unit 126 may temporarily store the command CMD, the address ADDR, the control signal CTRL, and pieces of data DATA that are provided through an input and output line I/O from the outside of the non-volatile memory device 120. The input and output (I/O) circuit unit 126 temporarily stores read data of the non-volatile memory device 120 and may output the read data to the outside through the input and output line I/O at a designated point in time.

The voltage generator 127 may generate various kinds of voltages for performing a program operation, a read operation, and an erase operation on the memory cell array 122 based on a voltage control signal CTRL_Vol. In detail, the voltage generator 127 may generate a word line voltage VWL, for example, a programming voltage, a reading voltage, a passing voltage, an erase verifying voltage, or a program verifying voltage. In addition, the voltage generator 127 may generate a string selection line voltage and a ground selection line voltage based on the voltage control signal CTRL_Vol. In addition, the voltage generator 127 may generate an erasing voltage to be provided to the memory cell array 122.

Figure 3:
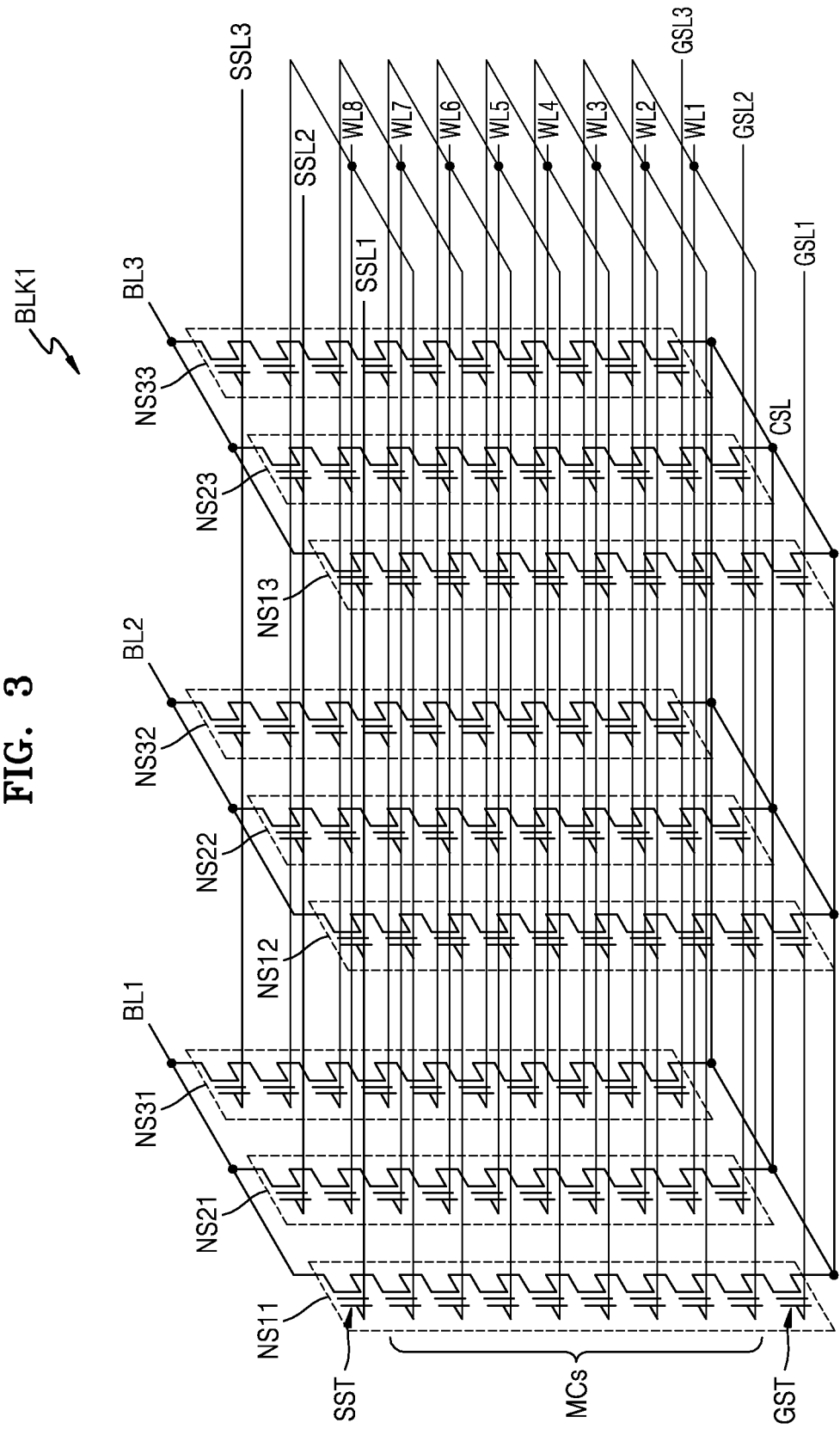
FIG. 3 is an equivalent circuit diagram of a first memory block of FIG. 2.

FIG. 3 is an equivalent circuit diagram of the first memory block BLK1 of FIG. 2.

Referring to FIG. 3, the first memory block BLK1 may include NAND strings NS11 to NS33, word lines WL1 to WL8, bit lines BL1 to BL3, ground selection lines GSL1 to GSL3, string selection lines SSL1 to SSL3, and a common source line CSL.

Each NAND string (for example, NS11) may include a serially connected string selection transistor SST, a plurality of memory cells MC, and a ground selection transistor GST. The string selection transistor SST is connected to a corresponding string selection line SSL1. The plurality of memory cells MC are respectively connected to the corresponding word lines WL1 to WL8. The ground selection transistor GST is connected to the corresponding ground selection line GSL1. The string selection transistor SST is connected to the corresponding bit lines BL1 through BL3, and the ground selection transistor GST is connected to the common source line CSL.

Among the NAND strings NS11 to NS33, the NAND strings NS11, NS12, and NS13 of a first row may be commonly connected to the first string selection line SSL1. The NAND strings NS21, NS22, and NS23 of a second row may be commonly connected to the second string selection line SSL2. The NAND strings NS31, NS32, and NS33 of a third row may be commonly connected to the third string selection line SSL3. The NAND strings NS11, NS12, and NS13 of the first row may configure a first plane PLN-SSL1 (refer to FIG. 5A) and the NAND strings NS21, NS22, and NS23 of a second row may configure a second plane PLN_SSL2 (refer to FIG. 5A), and the NAND strings NS31, NS32, and NS33 of a third row may configure a third plane PLN_SSL3 (refer to FIG. 5). In FIG. 3, the first memory block BLK1 shows the three planes PLN_SSL1, PLN_SSL2, and PLN_SSL3 connected to the three bit lines BL1 to BL3. However, example embodiments are not limited thereto.

The number of rows and columns of the NAND strings in the first memory block BLK1 may increase or may be reduced. As the number of rows of the NAND strings changes, the number of planes may change. As the number of columns of the NAND strings changes, the number of bit lines connected to the columns of the NAND strings and the number of the NAND strings connected to one string selection line may change. A height of the NAND strings may increase or may be reduced. For example, the number of memory cells laminated in each of the NAND strings may increase or may be reduced.

Figure 4:
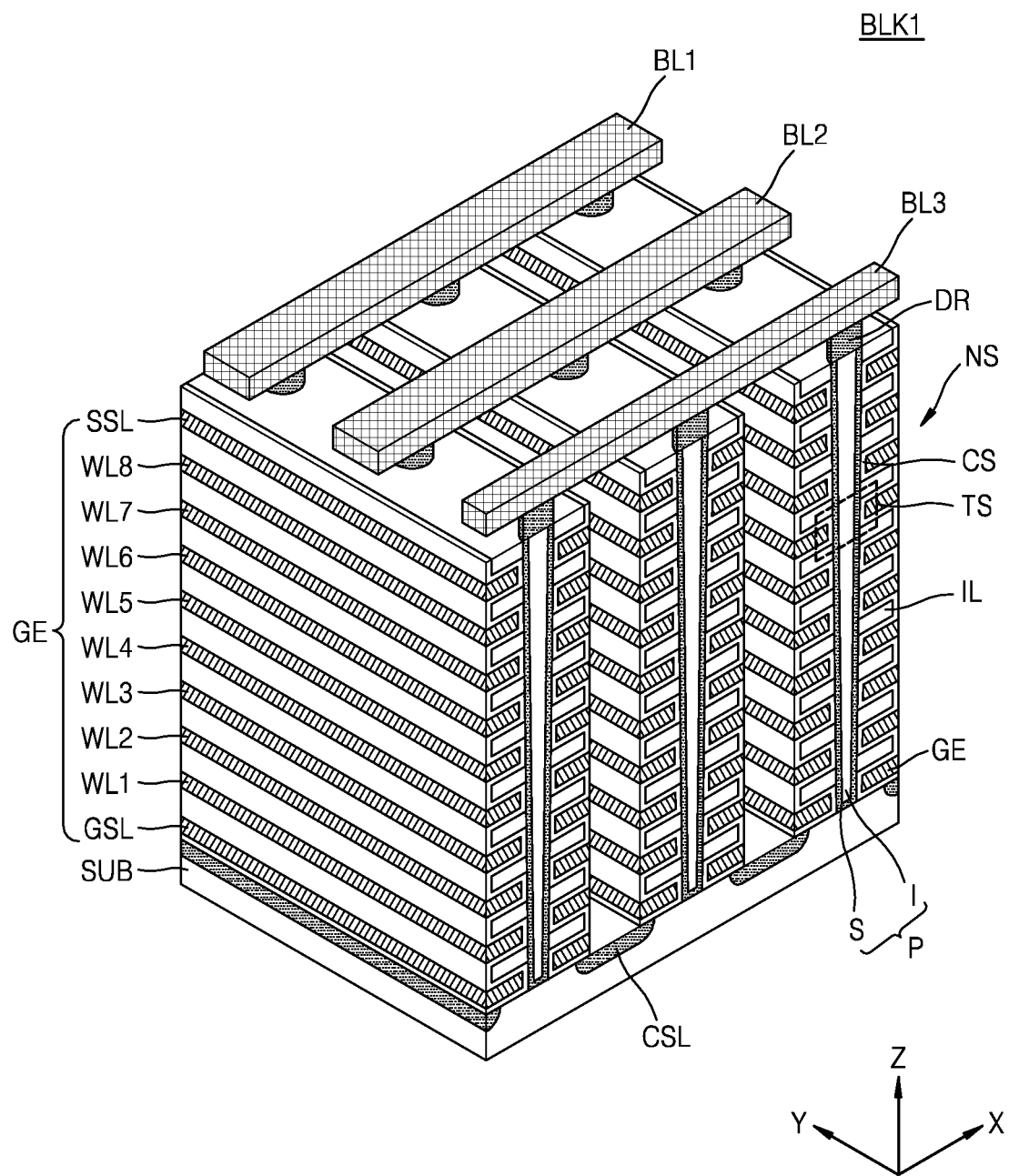
FIG. 4 is a perspective view illustrating an example of the first memory block of FIG. 2.

FIG. 4 is a perspective view illustrating an example of the first memory block BLK1 of FIG. 2.

Referring to FIG. 4, the first memory block BLK1 is perpendicular to a substrate SUB. The substrate SUB has a first conductivity type (for example, P-type). Common source lines CSL that extend in a first direction y on the substrate SUB and that are doped with second conductivity type (for example, N-type) impurities are provided. Insulating layers IL that extend in the first direction y are sequentially provided on an area of the substrate SUB between the two adjacent common source lines CSL in a third direction z. The insulating layers IL are separated from each other by a specific distance in the third direction z.

Pillars P sequentially arranged on the area of the substrate SUB between the two adjacent common source lines CSL in the first direction y and passing through the insulating layers IL in the third direction z are provided. For example, the pillars P contact the substrate SUB through the insulating layers IL. In detail, a surface layer S of each pillar P may include a silicon material having a first type and may function as a channel area. On the other hand, an internal layer I of each pillar P may include an insulating material such as a silicon oxide or an air gap.

In the area between the two adjacent common source lines CSL, a charge storage layer CS is provided along the insulating layers IL, the pillars P and an exposed surface of the substrate SUB. The charge storage layer CS may include a tunneling insulating layer, a charge trap layer, and a blocking insulating layer. In addition, in the area between the two adjacent common source lines CSL, on an exposed surface of the charge storage layer CS, a gate electrode GE such as the selection lines GSL and SSL and the word lines WL1 to WL8 is provided. Drain contacts DR are respectively provided on the plurality of pillars P. For example, the drain contacts DR may include a silicon material doped with the second conductivity type impurities. The bit lines BL1 through BL3 arranged to extend in a second direction x and to be separate from each other in the first direction y by a specific distance are provided on the drains DR.

The non-volatile memory device 120 is highly integrated, has a large capacity, and has a high function due to increase in chip size. In accordance with such a trend, a line width of a circuit is reduced, processes increase, and complexity increase. Such conditions may lead to occurrence of defective cells. The defective cells may be divided into defective cells related to word lines and defective cells related to bit lines.

Presence of the defective cells related to the word lines may be determined based on differences in program or erase speeds among segments connected to the word lines and results obtained by comparing program or erase speeds of the segments with a set (or, alternatively, a predetermined) reference value. When there is a defect such as a bridge between a selected word line and a neighboring word line, leakage current that flows from the selected word line to the neighboring word line may be occurred. Due to the leakage current, program speeds of memory cells connected to the selected word line may be reduced due to leakage current.

Presence of defective cells related to the bit lines may be determined by program or erase verification on memory cells connected to a selected page after program or erase operation. Bit lines are connected to a page buffer formed of a sense amplifier and data latch. Pass or fail may be determined with respect to sensing data of a page selected through a pass/fail comparator and a register. When a failed bit line represents a column defect, the column defect may be referred to as a defective string.

Figure 5A:
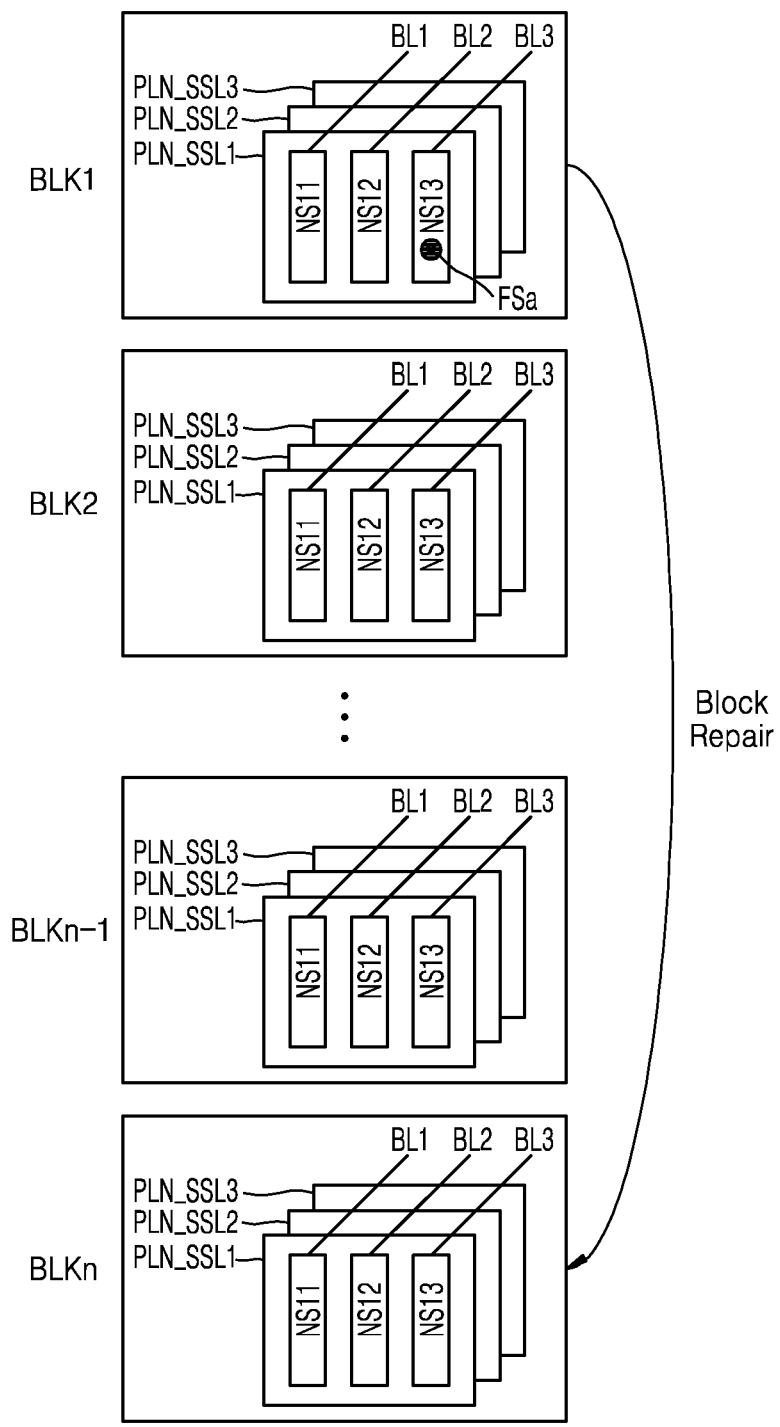
FIGS. 5A and 5B are views illustrating a common block repairing method of repairing defective strings.
Figure 5B:
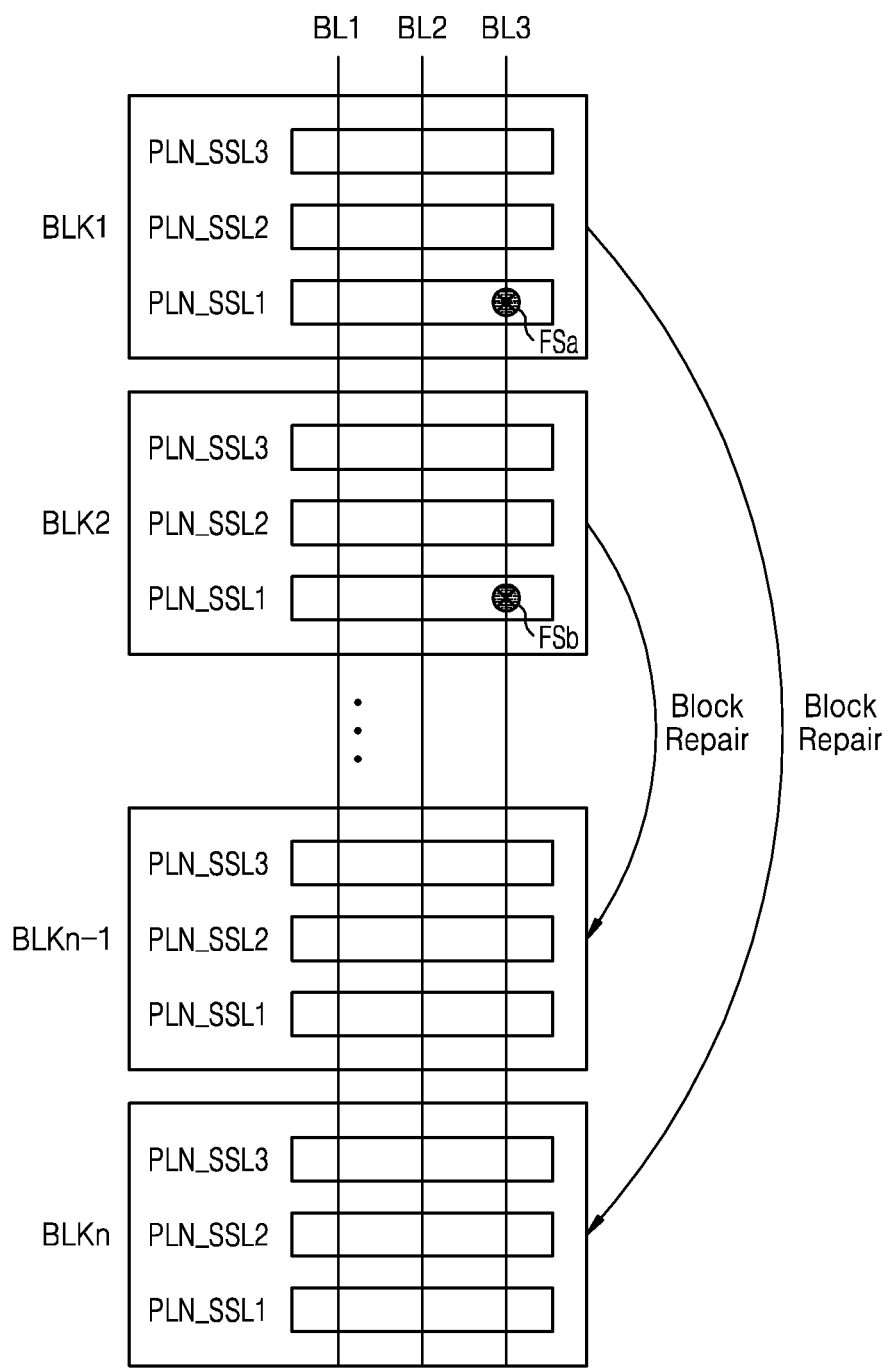

FIGS. 5A and 5B are views illustrating a common block repairing method of repairing defective strings. FIGS. 5A and 5B illustrate memory blocks BLK1 to BLKn formed of first, second, and third planes PLN_SSL1, PLN_SSL2, and PLN_SSL3 in order to simplify reference based on the equivalent circuit diagram of first memory block BLK1 of FIG. 3. FIG. 5A illustrates that there is a defective string in the first memory block BLK1 and FIG. 5B illustrates that there are defective strings in the first and second memory blocks BLK1 and BLK2.

In FIG. 5A, it is assumed that there is a defective string related to the third bit line BL3 in the first memory block BLK1 among the plurality of memory blocks BLK1 to BLKn. For example, it is assumed that there is a defect in a memory cell FSa of a NAND string NS13 connected to the third bit line BL3 among memory cells of the first plane PLN_SS1 connected to the first string selection line SSL1 in the first memory block BLK1. According to a common block repairing method, the first memory block BLK1 including the defective memory cell FSa is processed as a bad block and access thereto is blocked. The first memory block BLK1 may be replaced by any of the other memory blocks BLK2 to BLKn. For example, the first memory block BLK1 may be replaced by the nth memory block BLKn.

Referring to FIG. 5B, it is assumed that there is a defect in a memory cell FSa connected to the third bit line BL3 among the memory cells of the first plane PLN_SSL1 connected to the first string selection line SSL1 in the first memory block BLK1 and there is a defect in a memory cell FSb connected to the third bit line BL3 among the memory cells of the first plane PLN_SSL1 connected to the first string selection line SSL1 in the second memory block BLK2.

According to a common block repairing method, the first and second memory blocks BLK1 and BLK2 including the defective memory cells FSa and FSb are processed as bad blocks and access thereto is blocked. The first memory block BLK1 may be replaced by the nth memory block BLKn and the second memory block BLK2 may be replaced by the (n−1)th memory block.

In such a block repairing method, when the number of bad blocks in the memory cell array is large, after limited repair memory blocks are replaced by bad blocks, the remaining bad blocks may not be repaired. In this case, a memory capacity of the non-volatile memory device 120 may be reduced. Therefore, a repairing method capable of efficiently using a repair memory block is required.

Figure 6A:
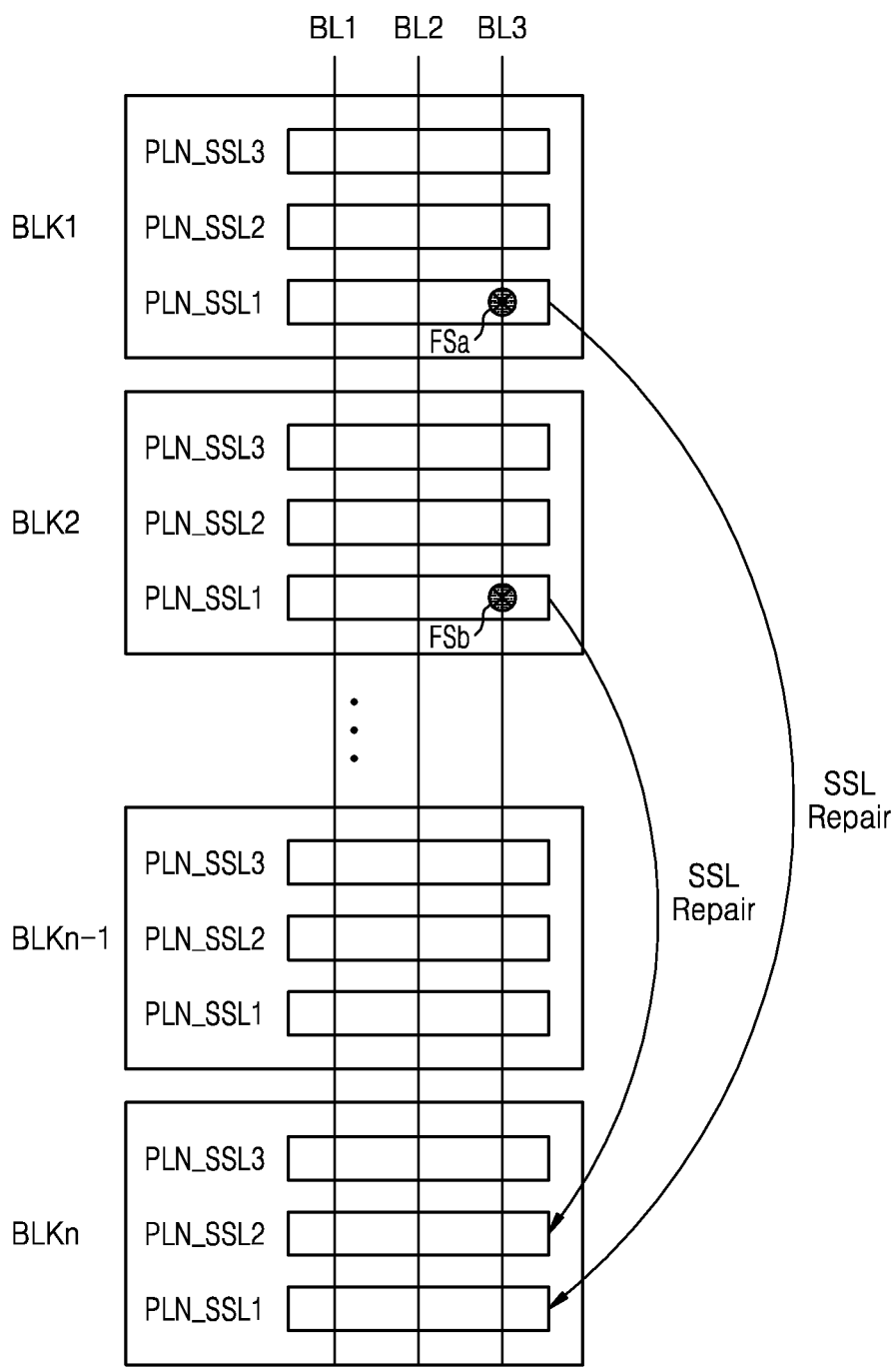
FIGS. 6A and 6B are views illustrating a method of repairing defective strings in units of string selection lines according to an example embodiment of the inventive concepts.
Figure 6B:
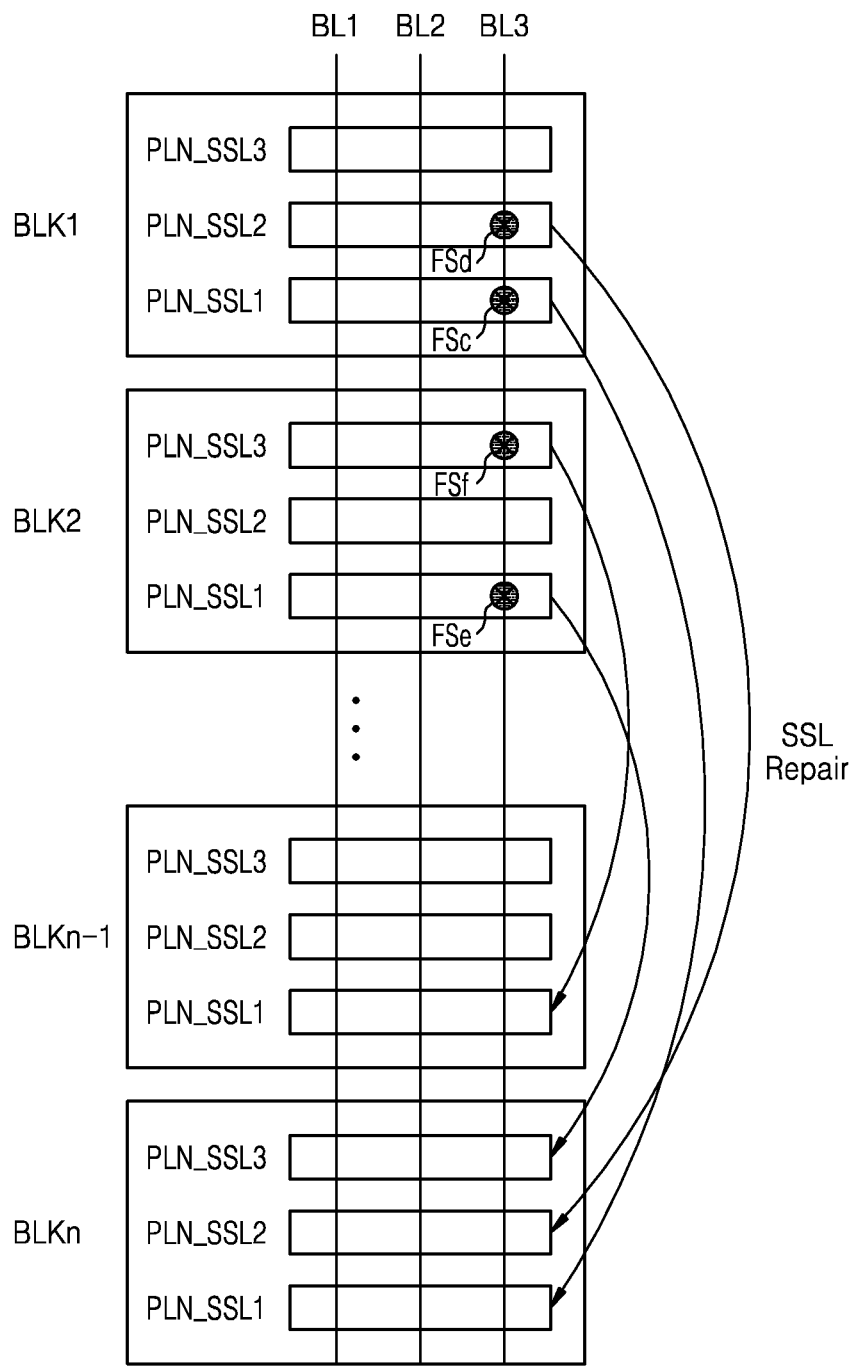

FIGS. 6A and 6B are views illustrating a method of repairing defective strings in units of string selection lines according to an example embodiment of the inventive concepts. As discussed below, in one or more example embodiments, a repair operation is performed in units of string selection lines or planes, and, thus the repair memory block may be efficiently used. Hereinafter, for convenience sake, the method of repairing defective strings in units of string selection lines and the method of repairing defective strings in units of planes will be considered to be the same.

Referring to FIG. 6A, like in FIG. 5B, the memory cells FSa and FSb connected to the third bit line BL3 are defective in the first and second memory blocks BLK1 and BLK2. Since the defective memory cell FSa of the first memory block BLK1 is in the first plane PLN_SSL1 connected to the first string selection line SSL1, a first plane PLB_SSL1 of the first memory block BLK1 is a defective plane. Since the defective memory cell FSb of the second memory block BLK2 is in the first plane PLN_SSL1 connected to the first string selection line SSL1, the first plane PLB_SSL1 of the second block BLK2 is a defective plane.

By using the method of repairing defective strings in units of string selection lines, the first defective plane PLB_SSL1 of the first memory block BLK1 is replaced by the first plane PLN_SSL1 of the nth memory block BLKn and the first defective plane PLB_SSL1 of the second memory block BLK2 may be replaced by the second plane PLN_SSL2 of the nth memory block BLKn. That is, the memory cells connected to the first string selection line SSL1 of the first memory block BLK1 are replaced by the memory cells connected to the first string selection line SSL1 of the nth memory block BLKn and the memory cells connected to the first string selection line SSL1 of the second memory block BLK2 may be replaced by the memory cells connected to the second string selection line SSL2 of the nth memory block BLKn.

According to another example embodiment, the first defective plane PLB_SSL1 of the first memory block BLK1 is replaced by the second plane PLN_SSL2 of the nth memory block BLKn and the first defective plane PLB_SSL1 of the second memory block BLK2 may be replaced by the first plane PLN_SSL1 of the nth memory block BLKn. In this case, the memory cells connected to the first string selection line SSL1 of the first memory block BLK1 are replaced by the memory cells connected to the second string selection line SSL2 of the nth memory block BLKn and the memory cells connected to the first string selection line SSL1 of the second memory block BLK2 may be replaced by the memory cells connected to the first string selection line SSL1 of the nth memory block BLKn.

In the block repairing method of FIG. 5B, the first and second memory blocks BLK1 and BLK2 are processed as bad blocks and are not accessed. On the other hand, in the method of repairing detective strings in units of string selection lines, although the defective memory cells FSa and FSb are in in the first and second memory blocks BLK1 and BLK2, the first and second memory blocks BLK1 and BLK2 are not processed as bad blocks but are continuously accessed. As the first defective planes PLN_SSL1 of the first and second memory blocks BLK1 and BLK2 are replaced by one memory block, that is, the first and second planes PLN_SSL1 and PLN_SSL2 of the nth memory block BLKn, the (n−1)th memory block BLKn_1 may be used for replacing other defective planes.

Referring to FIG. 6B, among the memory cells of the first and second planes PLN_SSL1 and PLN_SSL2 respectively connected to the first and second string selection lines SSL1 and SSL2 in the first memory block BLK1, the memory cells FSc and FSd connected to the third bit line BL3 are defective and, among the memory cells of the first and third memory planes PLN_SSL1 and PLN_SSL3 respectively connected to the first and third string selection lines SSL1 and SSL3 in the second memory block BLK2, memory cells FSe and FSf connected to the third bit line BL3 are defective.

By using the method of repairing defective strings in units of string selection lines, the first defective plane PLB_SSL1 of the first memory block BLK1 is replaced by the first plane PLN_SSL1 of the nth memory block BLKn and the second defective plane PLB_SSL1 of the first memory block BLK1 may be replaced by the second plane PLN_SSL2 of the nth memory block BLKn. The first defective plane PLB_SSL1 of the second memory block BLK2 may be replaced by the third plane PLN_SSL3 of the nth memory block BLKn and the defective third plane PLB_SSL3 of the second memory block BLK2 may be replaced by the first plane PLN_SSL1 of the (n-i)th memory block BLKn−1.

The (n−1)th and nth memory blocks BLKn−1 and BLKn used for replacing defective planes may be set by the control logic block 124 among the memory blocks that do not include defective planes. The (n−1)th and nth memory blocks BLKn−1 and BLKn may be redundant memory blocks set to be exclusively used for the method of repairing defective strings in units of string selection lines.

In the above-described method of repairing defective strings in units of string selection lines, limited repair memory blocks may be more efficiently used than in the block repairing method.

Figure 7:
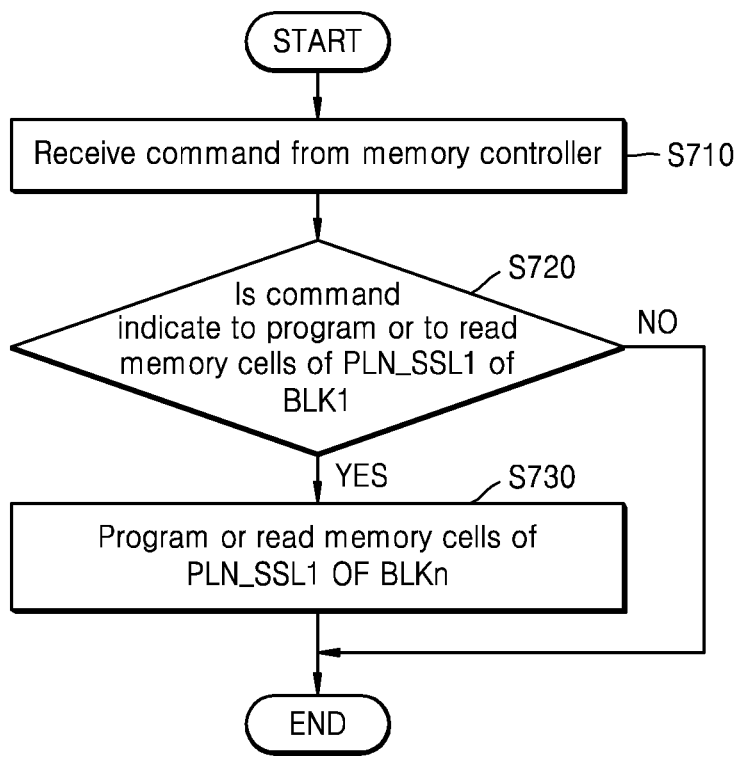
FIGS. 7 and 8 are flowcharts illustrating operation of a non-volatile memory device that performs a method of repairing defective strings in units of string selection lines according to an example embodiment of the inventive concepts.
Figure 8:
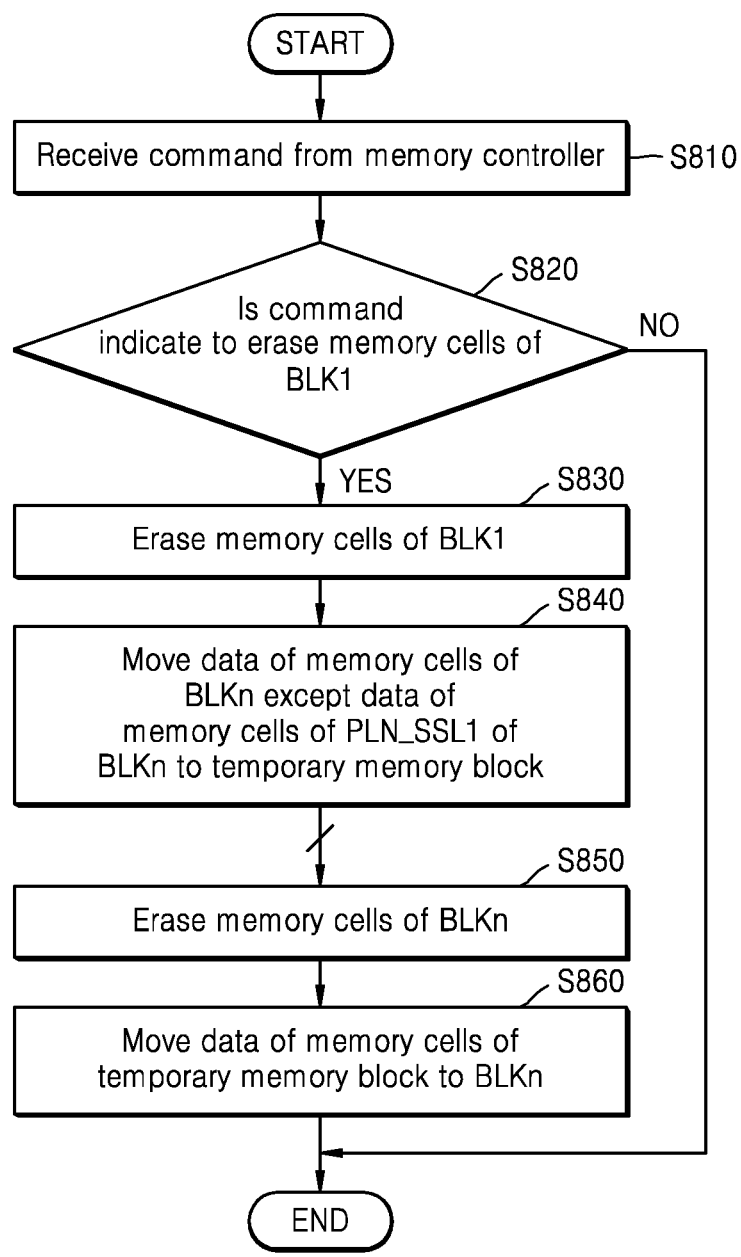

FIGS. 7 and 8 are flowcharts illustrating operation of a non-volatile memory device that performs a method of repairing defective strings in units of string selection lines according to an example embodiment of the inventive concepts. FIG. 7 illustrates a program or read operation of the non-volatile memory device and FIG. 8 illustrates erase operation of the non-volatile memory device.

Referring to FIG. 7, the non-volatile memory device 120 (refer to FIG. 2) performs the method of repairing defective strings in units of string selection lines of FIGS. 6A and 6B and may perform a program or read operation. In order to facilitate understanding of example embodiments of the inventive concepts, a program or read operation of the first memory block BLK1 including the first defective plane PLN_SSL1 described in FIG. 6A will be described.

In operation S710, the control logic block 124 of the non-volatile memory device 120 may receive a command CMD provided by the memory controller 110 (FIG. 1). The command CMD may command the non-volatile memory device 120 to perform various operations.

In operation S720, the control logic block 124 may determine whether the command CMD received in the operation S710 commands the non-volatile memory device 120 to perform a program or read operation on the memory cells of the first defective plane PLN_SSL1 of the first memory block BLK1. When the received command does not command the non-volatile memory device 120 to perform a program or read operation on the memory cells of the first defective plane PLN_SSL1 of the first memory block BLK1, the non-volatile memory device 120 performs an operation commanded by the received command.

When the received command commands the non-volatile memory device 120 to perform a program or read operation on the memory cells of the first defective plane PLN_SSL1 of the first memory block BLK, in operation S730, the non-volatile memory device 120 performs a program or read operation on the memory cells of the first plane PLN_SSL1 of the nth memory block BLKn. For example, the control logic block 124 of the non-volatile memory device 120 may not access the memory cells of the first defective plane PLN_SSL1 of the first memory block BLK1 and may perform a program or read operation on the memory cells of the first plane PLN_SSL1 of the nth memory block BLKn that replaces the first defective plane PLN_SSL1 of the first memory block BLK1.

According to the above-described program or read operation, when the command provided from the memory controller 110 commands the non-volatile memory device 120 to access a defective plane, the non-volatile memory device 120 accesses a plane replaced by the method of repairing defective strings in units of string selection lines instead of the defective plane and may perform an operation commanded by the command.

Referring to FIG. 8, the non-volatile memory device 120 (refer to FIG. 2) performs the method of repairing defective strings in units of string selection lines of FIGS. 6A and 6B and may perform an erase operation. In order to facilitate understanding of example embodiments of the inventive concepts, an erase operation of the first memory block BLK1 including the first defective plane PLN_SSL1 described in FIG. 6A will be described.

In operation S810, the control logic block 124 may receive a command CMD provided by the memory controller 110 (FIG. 1). The command CMD may command the non-volatile memory device 120 to perform various operations.

In operation S820, the control logic block 124 may determine whether the command CMD received in the operation S810 commands the non-volatile memory device 120 to perform an erase operation on the memory cells of the first memory block BLK1. When the received command does not command the non-volatile memory device 120 to perform an erase operation on the memory cells of the first memory block BLK1, the non-volatile memory device 120 performs an operation commanded by the received command.

When the received command commands the non-volatile memory device 120 to perform an erase operation on the memory cells of the first memory block BLK, in operation S830, the non-volatile memory device 120 performs an erase operation on the memory cells of the first memory block BLK1. For example, the control logic block 124 may erase data of the memory cells of the first memory block BLK1 and erase data of the memory cells of the first plane PLN_SSL1 of the nth memory block BLKn that replaces the first defective plane PLN_SSL1 of the first memory block BLK1.

In order to erase the data of the memory cells of the first plane PLN-SSL1 of the nth memory block BLKn, in operation S840, the control logic block 124 may temporarily move data of memory cells except for the memory cells of the first plane PLN_SSL among the memory cells of the nth memory block BLKn to a temporarily set memory block. For example, the control logic block 124 may read the data of the memory cells except for the memory cells of the first plane PLN_SSL1 among the memory cells of the nth memory block BLKn in units of pages, store the data in a register provided in the control logic block 124, and may program the data stored in the register in the temporarily set memory block. That is, the non-volatile memory device 120 may perform a copy-back operation between different blocks.

In operation S850, the control logic block 124 performs an erase operation on the memory cells of the nth memory block BLKn. The non-volatile memory device 120 may perform an operation of erasing the data of the memory cells of the nth memory block BLKn.

In operation S860, the control logic block 124 moves the data temporarily programmed to the memory cells of the temporarily set memory block in the operation S840 back to the nth memory block BLKn. For example, the control logic block 124 may read the data of the memory cells of the temporarily set memory block in units of pages, store the data in the register, and may program the data stored in the register to the nth memory block BLKn. That is, the non-volatile memory device 120 may perform a copy-back operation between different blocks.

According to the above-described erase operation, when the command provided by the memory controller 110 commands the non-volatile memory device 120 to erase a memory block including a defective plane, an erase operation may be performed not only on the memory block including the defective plane but also on a memory block including a plane replaced by the memory of repairing defective string in units of string selection lines instead of a defective plane.

As discussed above, a block copy-back operation may be performed on the memory block including the replaced plane at least twice, which may burden the performance of the non-volatile memory device 120. In order to reduce the burden, the non-volatile memory device 120 may reduce access to the memory block including the defective plane.

For example, the control logic block 124 of the non-volatile memory device 120 may set wear level in accordance with a program and erase P/E operation of the first memory block BLK1 to be high in order to reduce access to the memory block including the defective plane, for example, the first memory block BLK1. The control logic block 124 may set wear level and/or an amount of valid data of the first memory block BLK1 to be high. Therefore, the memory controller 110 (refer to FIG. 1) may reduce the number of times of accessing the first memory considering abrasivity in accordance with the program and erase P/E operation of the first memory block BLK1 of the non-volatile memory device 120, the availability and/or the amount of valid data.

Figure 9:
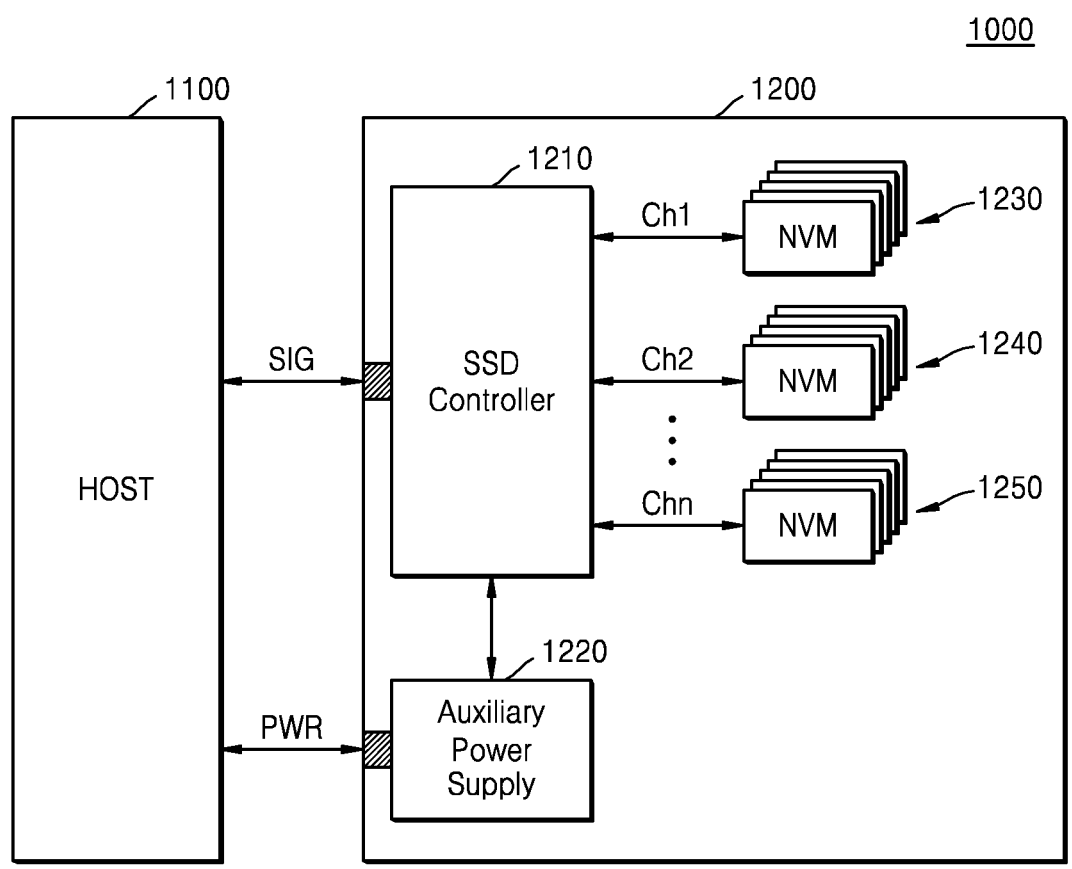
FIG. 9 is a block diagram illustrating an example solid state drive (SSD) system to which a non-volatile memory device that performs a method of repairing defective strings in units of string selection lines according to an example embodiment the inventive concepts is applied.

FIG. 9 is a block diagram illustrating an example SSD system to which a non-volatile memory device that performs a method of repairing defective strings in units of string selection lines according to an example embodiment of the inventive concepts is applied.

Referring to FIG. 9, an SSD system 1000 includes a host 1100 and an SSD 1200. The SSD 1200 transmits and receives a signal SIG to and from the host 1100 through a signal connector and receives power PWR through a power connector. The SSD 1200 includes an SSD controller 1210, an auxiliary power supply 1220, and a plurality of non-volatile memory devices 1230 to 1250.

The SSD controller 1210 may control the plurality of non-volatile memory devices 1230 to 1250 in response to the signal SIG received from the host 1100. For example, the SSD controller 1210 and the non-volatile memory devices 1230 to 1250 correspond to the memory controller and the non-volatile memory device, respectively, as described with reference to FIGS. 1 to 8.

The auxiliary power supply 1220 is connected to the host 1100 through the power connector. The auxiliary power supply 1220 receives the power PWR from the host 1100 and may perform charging. When power is not smoothly supplied from the host 1100, the auxiliary power supply 1220 may provide the power of the SSD system 1000. For example, the auxiliary power supply 1220 may be positioned in the SSD 1200 and may be positioned outside the SSD 1200. For example, the auxiliary power supply 1220 is positioned in a main board of the SSD system 1000 and may provide auxiliary power to the SSD 1200.

The plurality of non-volatile memory devices 1230 to 1250 are used as storage media of the SSD 1200. The plurality of non-volatile memory devices 1230 to 1250 may be connected to the SSD controller 1210 through a plurality of channels CH1 to CHn. One or more non-volatile memory devices may be connected to one channel. The non-volatile memory devices connected to one channel may be connected to the same data bus.

Each of the non-volatile memory devices 1230 to 1250 may replace a defective string selection line connected to a defective string of a defective memory block including a defective string among a plurality of memory blocks by a string selection line of a repair memory block. Each of the non-volatile memory devices 1230 to 1250 may access a replaced string selection line of a repair memory block instead of a defective string selection line of a defective memory block. Each of the non-volatile memory devices 1230 to 1250 may set abrasivity in accordance with a program and erase P/E operation of a defective memory block, availability, and/or an amount of valid data to be high in order to reduce access to the defective memory block.

Figure 10:
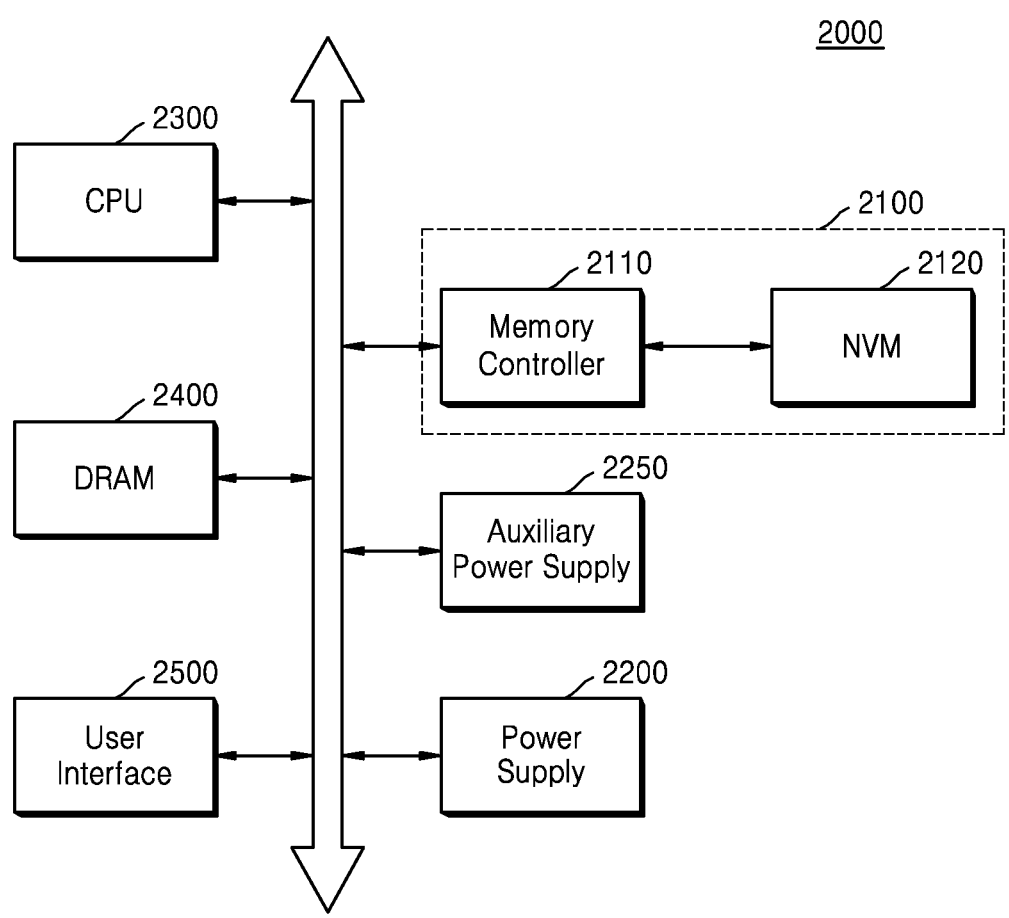
FIG. 10 is a block diagram illustrating an example in which a non-volatile memory device that performs a method of repairing defective strings in units of string selection lines according to an example embodiment the inventive concepts is implemented by an electronic device.

FIG. 10 is a block diagram illustrating an example in which a non-volatile memory device that performs a method of repairing defective strings in units of string selection lines according to an example embodiment of the inventive concepts is implemented by an electronic device.

Referring to FIG. 10, an electronic device 2000 may be implemented by a personal computer (PC) or a portable electronic device such as a laptop computer, a mobile telephone, a personal digital assistant (PDA), or a camera. The electronic device 2000 may include a memory device 2100, a power supply 2200, an auxiliary power supply 2250, a central processing unit (CPU) 2300, dynamic random access memory (DRAM) 2400, and a user interface 2500. The memory device 2100 may include a memory controller 2110 and a non-volatile memory device 2120.

The non-volatile memory device 2120 may repair defective strings by using the method of repairing defective strings in units of string selection lines that is described with reference to FIGS. 1 to 8. The non-volatile memory device 2120 may efficiently use limited repair memory blocks of the non-volatile memory device 2120.

While example embodiments of the inventive concepts have been particularly shown and described with reference to some example embodiments thereof, it will be understood that various changes in form and details may be made therein without departing from the spirit and scope of the following claims.

What is claimed is:

1. A method of repairing a defective string of a non-volatile memory device including a plurality of memory blocks, the method comprising:
   replacing a defective string selection line connected to the defective string of a defective memory block among the plurality of memory blocks with a replacement string selection line of a repair memory block, the repair memory block including first memory cells and second memory cells, the second memory cells being connected to the replacement string selection line; and
   accessing the replacement string selection line of the repair memory block instead of the defective string selection line of the defective memory block such that to perform an erase operation on memory cells connected to the defective string selection line in response to a command received from outside of the non-volatile memory device being an erase command associated with the memory cells connected to the defective string selection line, a copy-back operation between the repair memory block and a temporary memory block is performed on data of the first memory cells without moving data of the second memory cells by,
      erasing the memory cells of the defective memory block,
      moving the data of the first memory cells of the repair memory block to memory cells of the temporary memory block without moving the data of the second memory cells of the repair memory block connected to the replacement string selection line,
      erasing memory cells of the repair memory block, and
      moving the data stored in the memory cells of the temporary memory block back to the repair memory block.

2. The method of claim 1, wherein the replacing comprises:
   replacing the memory cells connected to the defective string selection line with the second memory cells connected to the replacement string selection line.

3. The method of claim 1, wherein the replacing comprises:
   selecting the repair memory block such that the repair memory block is a defect-free memory block included in the plurality of memory blocks.

4. The method of claim 3, wherein the defect-free memory block is a memory block exclusively used for the method of repairing the defective string.

5. The method of claim 1, wherein the accessing comprises:
   determining whether a command received from outside of the non-volatile memory device is a program command associated with the memory cells connected to the defective string selection line; and
   programming the second memory cells connected to the replacement string selection line in response to the program command being associated with the memory cells connected to the defective string selection line.

6. The method of claim 1, wherein the accessing comprises:
   determining whether a command received from outside of the non-volatile memory device is a read command associated with the memory cells connected to the defective string selection line; and
   reading the second memory cells connected to the replacement string selection line in response to the command being the read command associated with the memory cells connected to the defective string selection line.

7. The method of claim 1, wherein the accessing comprises:
   determining whether the command received from outside of the non-volatile memory device is the erase command associated with the memory cells connected to the defective string selection line among memory cells of the defective memory block.

8. The method of claim 7, wherein the moving of the data from the memory cells of the temporary memory block back to the repair memory block comprises:
   moving the data between the temporary memory block and the repair memory block.

9. A non-volatile memory device comprising:
   a memory cell array including a plurality of memory blocks, the plurality of memory blocks including a plurality of strings, the plurality of strings each including a plurality of memory cells connected to a same one of a plurality of string selection lines, the plurality of string selection lines including a defective string selection line connected to a defective string of a defective memory block among the plurality of memory blocks; and
   a controller configured to replace the defective string selection line with a replacement string selection line of a repair memory block among the plurality of memory blocks, the repair memory block including first memory cells and second memory cells, the second memory cells being connected to the replacement string selection line, the controller configured to replace the defective string selection line with the replacement string selection line such that to perform an erase operation on memory cells connected to the defective string selection line in response to receipt of an erase command associated with the second memory cells connected to the defective string selection line, a copyback operation between the repair memory block and a temporary memory block is performed on data of the first memory cells without moving data of the second memory cells by moving the data of the first memory cells of the repair memory block to the temporary memory block without moving the data of the second memory cells connected to the replacement string selection line.

10. The non-volatile memory device of claim 9, wherein the controller is configured to replace the memory cells connected to the defective string selection line with the second memory cells connected to the replacement string selection line.

11. The non-volatile memory device of claim 9, wherein the controller is configured to select the repair memory block such that the repair memory block is one of (i) a defect-free memory block included in the plurality of the memory blocks or (ii) a memory block exclusively used for repairing the defective string.

12. The non-volatile memory device of claim 9, wherein, in response to receipt of a command associated with the memory cells connected to the defective string, the controller is configured to access the replacement string selection line of the repair memory block instead of the defective string selection line of the defective memory block, the command being received from outside of the non-volatile memory device.

13. The non-volatile memory device of claim 9, wherein the controller is configured to perform a program or read operation on the memory cells connected to the replaced string selection line in response to receipt of a program command or a read command associated with the second memory cells connected to the defective string selection line.

14. The non-volatile memory device of claim 9, wherein the controller is configured to perform the erase operation by erasing the memory cells of the repair memory block after moving the data of the first memory cells to the temporary memory block.

15. The non-volatile memory device of claim 14, wherein the controller is configured to perform the erase operation by moving the data stored in the memory cells of the temporary memory block back to the repair memory block after erasing the memory cells of the repair memory block.

16. A memory system comprising:
   a memory controller; and
   a non-volatile memory device including,
      a memory cell array including a plurality of memory blocks, the plurality of memory blocks including a plurality of strings, the plurality of strings each including a plurality of memory cells connected to a same one of a plurality of string selection lines; and
   a controller configured to,
      replace a defective string selection line connected to a defective string of a defective memory block among the plurality of memory blocks with a replacement string selection line of a repair memory block, the defective string selection line being one of the plurality of string selection lines, and the defective memory block and the repair memory block being ones of the plurality of memory blocks, and
      artificially inflate an abrasivity setting of the defective memory block such that the memory controller is configured to favor memory cells outside of the defective memory block.

17. The memory system of claim 16, wherein the controller is configured to artificially inflate the abrasivity setting of the defective memory block such that the memory controller is configured to favor performing a program operation and an erase operation on the memory cells outside of the defective memory block.

\* \* \* \* \*